US012701883B2

(12) United States Patent
Wang

(10) Patent No.: US 12,701,883 B2
(45) Date of Patent: Aug. 4, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Ziyi Wang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 1149 days.

(21) Appl. No.: 17/754,828

(22) PCT Filed: Mar. 10, 2022

(86) PCT No.: PCT/CN2022/080217
§ 371 (c)(1),
(2) Date: Aug. 31, 2023

(87) PCT Pub. No.: WO2023/159682
PCT Pub. Date: Aug. 31, 2023

(65) Prior Publication Data
US 2024/0107844 A1      Mar. 28, 2024

(30) Foreign Application Priority Data
Feb. 28, 2022    (CN) .......................... 202210206134.3

(51) Int. Cl.
*H10K 59/35*          (2023.01)
*G06F 3/044*          (2006.01)
(Continued)

(52) U.S. Cl.
CPC ......... *H10K 59/353* (2023.02); *G06F 3/0446* (2019.05); *H10K 59/352* (2023.02); *H10K 59/40* (2023.02); *H10K 59/65* (2023.02)

(58) Field of Classification Search
CPC ...... H10K 59/353; H10K 59/40; H10K 59/65; H10K 59/352; G06F 3/0446
See application file for complete search history.

(56) References Cited

U.S. PATENT DOCUMENTS 6,850,292 B1* 2/2005 Murade ............. G02F 1/136209
349/44
2014/0356584 A1* 12/2014 Yang ..................... H10F 71/138
428/173
(Continued)

FOREIGN PATENT DOCUMENTS

CN          107658332 A        2/2018
CN          109830521 A        5/2019
(Continued)

OTHER PUBLICATIONS

Chinese Office Action issued in corresponding Chinese Patent Application No. 202210206134.3 dated Apr. 24, 2024, pp. 1-9.
(Continued)

*Primary Examiner* — Ratisha Mehta
*Assistant Examiner* — Jacob Alexander Vlcek

(57)          ABSTRACT

The present application discloses a display panel and a display device. The display panel includes a functional display area and a conventional display area. The display panel further includes a substrate, a light-emitting layer and a touch layer sequentially disposed on the substrate. The touch layer includes an opening disposed in the functional display area, a barrier portion disposed around the opening, and a touch portion located on a side of the barrier portion
(Continued)

away from the opening; wherein at least a part of the barrier portion is disposed in the functional display area.

20 Claims, 10 Drawing Sheets

(51) Int. Cl.
      *H10K 59/40*          (2023.01)
      *H10K 59/65*          (2023.01)

(56)                    References Cited

U.S. PATENT DOCUMENTS

| | | | | |
|---|---|---|---|---|
| 2018/0225500 | A1* | 8/2018 | Han | H10K 59/65 |
| 2019/0050096 | A1* | 2/2019 | Wang | G09G 3/3225 |
| 2019/0361555 | A1 | 11/2019 | Lee | |
| 2020/0203445 | A1* | 6/2020 | Ou | H10K 59/1213 |
| 2020/0273919 | A1* | 8/2020 | Ding | H10K 59/40 |
| 2021/0216157 | A1* | 7/2021 | Jeong | G06F 3/0412 |
| 2023/0011418 | A1* | 1/2023 | Long | H10K 59/873 |
| 2023/0083811 | A1* | 3/2023 | Zhang | H10K 59/121 |
| | | | | 257/40 |

FOREIGN PATENT DOCUMENTS

| | | | |
|---|---|---|---|
| CN | 110286803 | A | 9/2019 |
| CN | 111799320 | A | 10/2020 |
| CN | 112799550 | A | 5/2021 |
| CN | 113346031 | A | 9/2021 |
| CN | 113495643 | A | 10/2021 |
| CN | 114089873 | A | 2/2022 |
| JP | 2013161448 | A | 8/2013 |
| JP | 2016224631 | A | 12/2016 |
| WO | 2022011749 | A1 | 1/2022 |

OTHER PUBLICATIONS

International Search Report in International application No. PCT/CN2022/080217, mailed on Nov. 28, 2022.
Written Opinion of the International Search Authority in International application No. PCT/CN2022/080217, mailed on Nov. 28, 2022.

* cited by examiner $\left.\begin{array}{c} 2 \\ 1 \end{array}\right\}$10

102

101

1011

DISPLAY PANEL AND DISPLAY DEVICE

TECHNICAL FIELD

The present application relates to a technical field of display, and in particular to a display panel and a display device having the same.

BACKGROUND

Organic Light-Emitting Diode (OLED) display panels are widely used in virtue of advantages such as self-emitting, fast response speed, wide viewing angle, and flexible display.

In order to increase a screen ratio of a display panel, an existing OLED display panel designs a Camera Under Panel (CUP). Further, in the related art, it is often to dispose a touch layer in an OLED display panel to increase a level of integration of the OLED display panel and reduce a thickness of the OLED display panel. In order to prevent the touch layer from affecting a light transmittance of a CUP area, the touch layer is usually removed from the CUP area to improve the light transmittance of the CUP area and further improve an imaging effect of the camera under panel.

However, in the manufacturing process, the metal in the touch layer is usually patterned with an etching solution to obtain touch electrode patterns and to form openings in the CUP area. More metal in the touch layer is removed from the CUP area, more etching solution in the CUP area is required than in the other areas. Thus, the touch electrode adjacent to the CUP area may be etched by the etching solution in the CUP area during an etching process. As a result, it is easy to reduce a line width of the touch electrode adjacent to the CUP area and even fracture, thus affecting a yield of the OLED display panel.

Technical Problems

An embodiment of the present application provides a display panel and a display device, which can avoid a touch portion from being etched in an etching process and increase a yield of the display panel.

SUMMARY

An embodiment of the present application provides a display panel including a functional display area, and a conventional display area disposed around the functional display area;

wherein the display panel further includes:

a substrate;

a light-emitting layer disposed on the substrate and including a plurality of light-emitting pixels, wherein the plurality of light-emitting pixels includes a plurality of first light-emitting pixels disposed in the conventional display area and a plurality of second light-emitting pixels disposed in the functional display area; and in a same unit area, a number of the first light-emitting pixels is same as a number of the second light-emitting pixels;

a touch layer disposed on a side of the light-emitting layer away from the substrate, wherein the touch layer includes an opening disposed in the functional display area, a barrier portion disposed around the opening, and a touch portion disposed on a side of the barrier portion away from the opening and located at least in the conventional display area; and the barrier portion is insulated from the touch portion;

wherein at least a part of the barrier portion is disposed in the functional display area, and an orthographic projection of the barrier portion on the substrate is not overlapped with the orthographic projections of the first light-emitting pixels on the substrate and the orthographic projections of the second light-emitting pixels on the substrate.

In an embodiment of the present application, the touch section includes a plurality of touch electrodes, the touch electrodes include a plurality of first metal grids electrically connected to each other, and at least a part of the first metal grids is disposed corresponding to the first light-emitting pixels and is not overlapped with the first light-emitting pixels corresponding thereto;

the barrier portion includes a plurality of second metal grids electrically connected to each other, each of the second metal grids is disposed corresponding to the second light-emitting pixels or the first light-emitting pixels, and each of the second metal grids is not overlapped with the second light-emitting pixels or the first light-emitting pixels corresponding thereto;

wherein in the same unit area, a number of the second metal grids is same as a number of the first metal grids.

In an embodiment of the present application, a minimum distance between each of the second metal grids and each of the second light-emitting pixels corresponding thereto is greater than a minimum distance between each of the first metal grids and each of the first light-emitting pixels corresponding thereto.

In an embodiment of the present application, the minimum distance between each of the second metal grids and each of the second light-emitting pixels corresponding thereto is greater than a minimum distance between each of the second metal grids and each of the first light-emitting pixels corresponding thereto.

In an embodiment of the present application, an area of the second light-emitting pixels of a first color is smaller than an area of the first light-emitting pixels of the first color, and the first color includes any color of red, green, and blue.

In an embodiment of the present application, the barrier portion is provided with at least two of the second metal grids in a direction away from a center of the opening.

In an embodiment of the present application, a line width in the second metal grids is less than or equal to a line width in the first metal grids.

In an embodiment of the present application, a part of the first metal grids is further disposed corresponding to the second light-emitting pixels and is not overlapped with the second light-emitting pixels corresponding thereto, and the second metal grids are disposed corresponding to the second light-emitting pixels and are not overlapped with the second light-emitting pixels corresponding thereto.

In an embodiment of the present application, the functional display area includes a euphotic display sub-area, and a transition sub-area between the euphotic display sub-area and the conventional display area;

at least part of the barrier portion is disposed in the transition sub-area.

In an embodiment of the present application, the barrier portion is disposed outside the euphotic display sub-area.

According to the above object of the present application, a display device is provided. The display panel includes a display panel and a camera assembly, wherein the display panel includes a functional display area, and a conventional display area disposed around the functional display area, and the camera assembly is disposed on a side of the display panel and corresponding to the functional display area;

wherein the display panel further includes:

a substrate;

a light-emitting layer disposed on the substrate and including a plurality of light-emitting pixels, wherein the plurality of light-emitting pixels includes a plurality of first light-emitting pixels disposed in the conventional display area and a plurality of second light-emitting pixels disposed in the functional display area; and in a same unit area, a number of the first light-emitting pixels is same as a number of the second light-emitting pixels;

a touch layer disposed on a side of the light-emitting layer away from the substrate, wherein the touch layer includes an opening disposed in the functional display area, a barrier portion disposed around the opening, and a touch portion disposed on a side of the barrier portion away from the opening and located at least in the conventional display area; and the barrier portion is insulated from the touch portion;

wherein at least a part of the barrier portion is disposed in the functional display area, and an orthographic projection of the barrier portion on the substrate is not overlapped with the orthographic projections of the first light-emitting pixels on the substrate and the orthographic projections of the second light-emitting pixels on the substrate.

In an embodiment of the present application, the touch portion includes a plurality of touch electrodes, the touch electrodes include a plurality of first metal grids electrically connected to each other, and at least a part of the first metal grids is disposed corresponding to the first light-emitting pixels and is not overlapped with the first light-emitting pixels corresponding thereto;

the barrier portion includes a plurality of second metal grids electrically connected to each other, each of the second metal grids is disposed corresponding to the second light-emitting pixels or the first light-emitting pixels, and each of the second metal grids is not overlapped with the second light-emitting pixels or the first light-emitting pixels corresponding thereto;

wherein in the same unit area, a number of the second metal grids is same as a number of the first metal grids.

In an embodiment of the present application, a minimum distance between each of the second metal grids and each of the second light-emitting pixels corresponding thereto is greater than a minimum distance between each of the first metal grids and each of the first light-emitting pixels corresponding thereto.

In an embodiment of the present application, the minimum distance between each of the second metal grids and each of the second light-emitting pixels corresponding thereto is greater than a minimum distance between each of the second metal grids and each of the first light-emitting pixels corresponding thereto.

In an embodiment of the present application, an area of the second light-emitting pixels of a first color is smaller than an area of the first light-emitting pixels of the first color, and the first color includes any color of red, green, and blue.

In an embodiment of the present application, the barrier portion is provided with at least two of the second metal grids in a direction away from a center of the opening.

In an embodiment of the present application, a line width in the second metal grids is less than or equal to a line width in the first metal grids.

In an embodiment of the present application, a part of the first metal grids is further disposed corresponding to the second light-emitting pixels and is not overlapped with the second light-emitting pixels corresponding thereto, and the second metal grids are disposed corresponding to the second light-emitting pixels and are not overlapped with the second light-emitting pixels corresponding thereto.

In an embodiment of the present application, the functional display area includes a euphotic display sub-area, and a transition sub-area between the euphotic display sub-area and the conventional display area;

at least part of the barrier portion is disposed in the transition sub-area.

In one embodiment of the present application, the barrier portion is disposed outside the euphotic display sub-area.

Beneficial Effects

Compared with the prior art, in the present application, a barrier portion insulating from the touch portion is provided on a side of the touch portion close to the functional display area. However, in a process of manufacturing, the functional display area needs to be etched to remove more material from the touch layer so as to form the opening, thus, a large amount of etching solution is required for etching. In the present application, the barrier portion is disposed between the touch portion and the opening to act as a buffer therebetween. This is, the etching solution in the functional display area fails to etch the touch layer due to a barrier provided by the barrier portion, so that a yield of the etching is increased, and a yield of the touch layer and the display panel is increased.

BRIEF DESCRIPTION OF THE DRAWINGS

The technical solutions and other beneficial effects of the present application will be apparent from the detailed description of the specific embodiments of the present application with reference to the accompanying drawings.

DETAILED DESCRIPTION OF THE EMBODIMENTS

Figure 1:
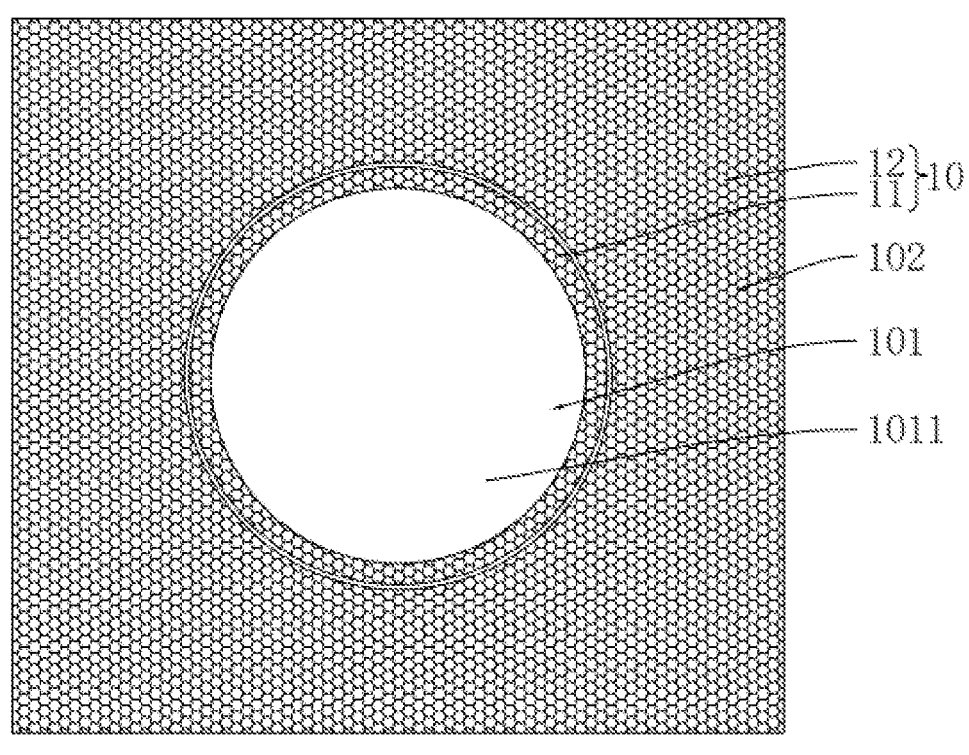
FIG. 1 is a plane distribution diagram of a display panel according to an embodiment of the present application.

The following describes the technical solutions of the embodiments of the present application clearly and completely with reference to the accompanying drawings in the embodiments of the present application. It will be apparent that the described embodiments are only some but not all of the embodiments of the present application. Based on the embodiments of the present application, all other embodiments obtained by those skilled in the art without creative effort fall within the scope of the present application.

The following disclosure provides many different embodiments or examples for implementing the different structures of the present application. In order to simplify the disclosure of the present application, the components and settings of the particular examples will be described below. Of course, they are merely examples and are not intended to limit the application. In addition, reference numerals and/or reference letters may be repeated in different examples of the present application for the purpose of simplicity and clarity, which do not indicate the relationship between the various embodiments and/or settings discussed. Furthermore, the present application provides examples of various specific processes and materials, but one of ordinary skill in the art may be aware of the application of other processes and/or the use of other materials.

Figure 2:
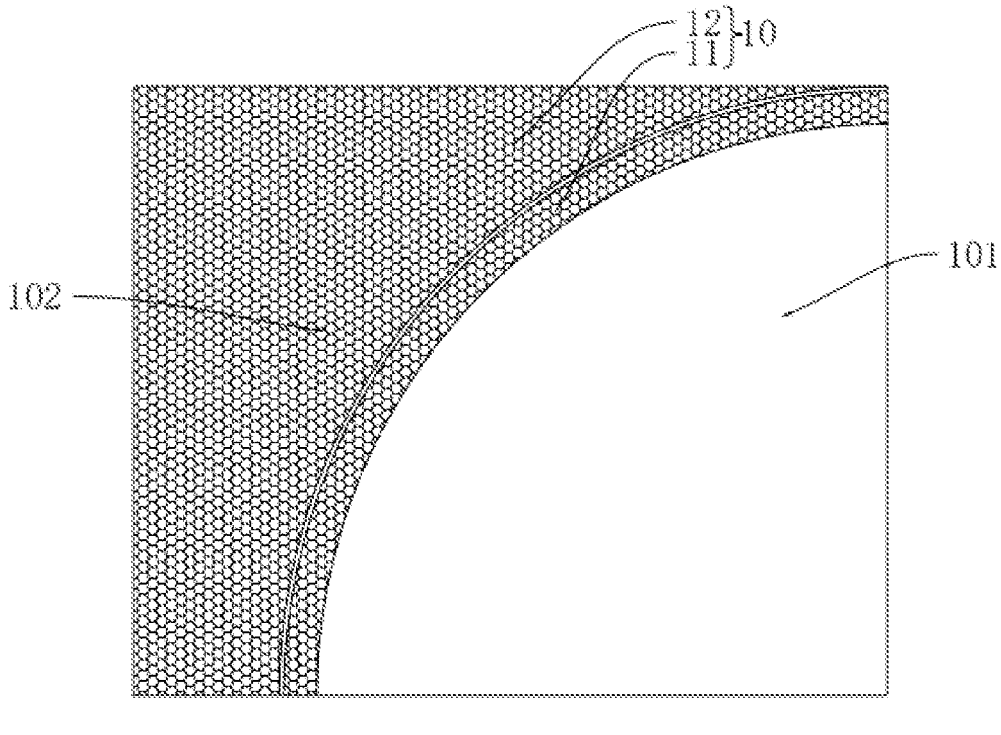
FIG. 2 is a partially enlarged plane schematic diagram of a display panel according to an embodiment of the present application.

The present embodiment provides a display panel. References are made to FIGS. 1-3, wherein the display panel includes a functional display area 101, and a conventional display area 102 disposed around the functional display area 101.

Further, the display panel further includes a substrate (not shown), a light-emitting layer 20, and a touch layer 10. The light-emitting layer 20 is disposed on the substrate. The light-emitting layer 20 includes a plurality of light-emitting pixels, and the plurality of light-emitting pixels include a plurality of first light-emitting pixels 21 disposed in the conventional display area 102 and a plurality of second light-emitting pixels 22 disposed in the functional display area 101. In a same unit area, the number of the second light-emitting pixels 22 is same as the number of the first light-emitting pixels 21. The touch layer 10 is disposed on a side of the light-emitting layer 20 away from the substrate. The touch layer 10 includes an opening 1011 disposed in the functional display area 101, a barrier portion 12 disposed around the opening 1011, and a touch portion 11 located on a side of the barrier portion 12 away from the opening 1011 and located at least in the conventional display area 102. The barrier portion 12 is insulated from the touch portion 11.

At least a part of the barrier portion 12 is disposed in the functional display area 101, and an orthographic projection of the barrier portion 12 on the substrate does not overlap orthographic projections of the second light-emitting pixels 22 on the substrate and orthographic projections of the first light-emitting pixels 21 on the substrate.

In an embodiment of the present application, the barrier portion 12 insulating with the touch portion 11 is provided on a side of the touch portion 11 close to the functional display area 101. Since the functional display area 101 needs to be etched to remove a large amount of material from the touch layer so as to form the opening 1011, a large amount of etching solution is required for etching. In the embodiment of the present application, the barrier portion 12 is disposed between the touch portion 11 and the opening 1011 to act as a buffer therebetween. This is, the etching solution in the functional display area 101 fails to etch the touch portion 11 due to a barrier provided by the barrier portion 12, so that a yield of the etching of the touch portion 11 is increased, and a yield of the touch electrode and the display panel is increased.

Specifically, in an embodiment of the present application, referring to FIG. 1, FIG. 2, FIG. 3, and FIG. 4, the display panel includes a substrate, a thin film transistor layer disposed on the substrate, an anode layer disposed on a side of the thin film transistor layer away from the substrate, a pixel definition layer and a light-emitting layer 20 disposed on a side of the anode layer away from the thin film transistor layer, a cathode layer disposed on a side of the light-emitting layer away from the anode layer, and a touch layer 10 disposed on a side of the cathode layer away from the light-emitting layer 20. An encapsulation layer may be disposed between the cathode layer and the touch layer 10.

It should be understood that the above-described substrate, thin film transistor layer, anode layer, pixel definition layer, cathode layer, and encapsulation layer are not shown in the Figures. The thin film transistor layer includes a plurality of thin film transistors disposed on the substrate, and an insulating layer covering the thin film transistor. The anode layer includes a plurality of anodes, and each of the plurality of anodes is electrically connected to the thin film transistor. The pixel definition layer is disposed on the anode layer, and includes a pixel opening corresponding to each anode. In an embodiment of the present application, the plurality of anodes may be simultaneously distributed in the conventional display area 102 and the functional display area 101, and correspondingly, a plurality of pixel openings may be simultaneously distributed in the conventional display area 102 and the functional display area 101. The light-emitting layer 20 includes a plurality of light-emitting pixels corresponding to each of the plurality of pixel openings, and the plurality of light-emitting pixels are disposed on a corresponding anode and are simultaneously distributed in the conventional display area 102 and the functional display area 101. Further, the cathode layer may cover the light-emitting layer 20, the encapsulation layer may cover the cathode layer, and the touch layer 10 may be disposed on a side of the encapsulation layer away from the cathode layer.

Wherein the light-emitting layer 20 includes a plurality of second light-emitting pixels 22 disposed in the functional display area 101, and a plurality of first light-emitting pixels 21 disposed in the conventional display area 102. The second light-emitting pixels 22 are located in pixel openings in the functional display area 101, and the first light-emitting pixels 21 are located in pixel openings in the conventional display area 102. Further, in a same unit area, the number of the second light-emitting pixels is equal to the number of the first light-emitting pixels, so that the functional display area 101 may perform a normal display function.

It should be noted that, in an embodiment of the present application, the second light-emitting pixels 22 and the first light-emitting pixels 21 are arranged in a same manner, that is, a distance between geometric centers of adjacent second light-emitting pixels 22 is equal to a distance between geometric centers of adjacent first light-emitting pixels 21, and also equal to a distance between geometric centers of the second light-emitting pixel 22 and the first light-emitting pixel 21 adjacent to the second light-emitting pixel 22.

Optionally, shapes and individual areas of the second light-emitting pixels 22 and the first light-emitting pixels 21 may be the same or different. In an embodiment of the present application, an example is taken to illustrate, wherein the first light-emitting pixel 21 has a diamond shape or an ellipse shape, and the second light-emitting pixel 22 has a circle shape. Further, among the plurality of first light-emitting pixels 21, a pixel with a largest area may be a blue pixel, and the blue pixel may be a diamond shape; a pixel with a smallest area may be a green pixel, and the green pixel may be an ellipse shape; and a pixel with an area between the largest area and the smallest area may be a red pixel, and the red pixel may be a diamond shape. Among the plurality of second light-emitting pixels 22, a pixel with a largest area may be a blue pixel, a pixel with a smallest area may be a green pixel, a pixel with an area between the largest area and the smallest area may be a red pixel; and the blue pixel, the red pixel, and the green pixel are circular shapes. Correspondingly, the area of the blue pixels in the plurality of second light-emitting pixels 22 is smaller than the area of the blue pixels in the plurality of first light-emitting pixels 21, the area of the red pixels in the plurality of second light-emitting pixels 22 is smaller than the area of the red pixels in the plurality of first light-emitting pixels 21, and the area of the green pixels in the plurality of second light-emitting pixels 22 is smaller than the area of the green pixels in the plurality of first light-emitting pixels 21. Further, an area ratio of the first light-emitting pixels 21 in the functional display area 101 may be reduced, thereby improving a light transmittance of the functional display area 101.

In the present embodiment, the touch layer 10 includes an opening 1011 disposed in the functional display area 101, a barrier portion 12 disposed around the opening 1011, and a touch portion 11 located on a side of the barrier portion 12 away from the opening 1011. The opening 1011 further improves the light transmittance of the functional display area 101. The barrier portion 12 and the touch portion 11 are insulated from each other, that is, the barrier portion 12 and the touch portion 11 may be spaced from each other.

Figure 4:
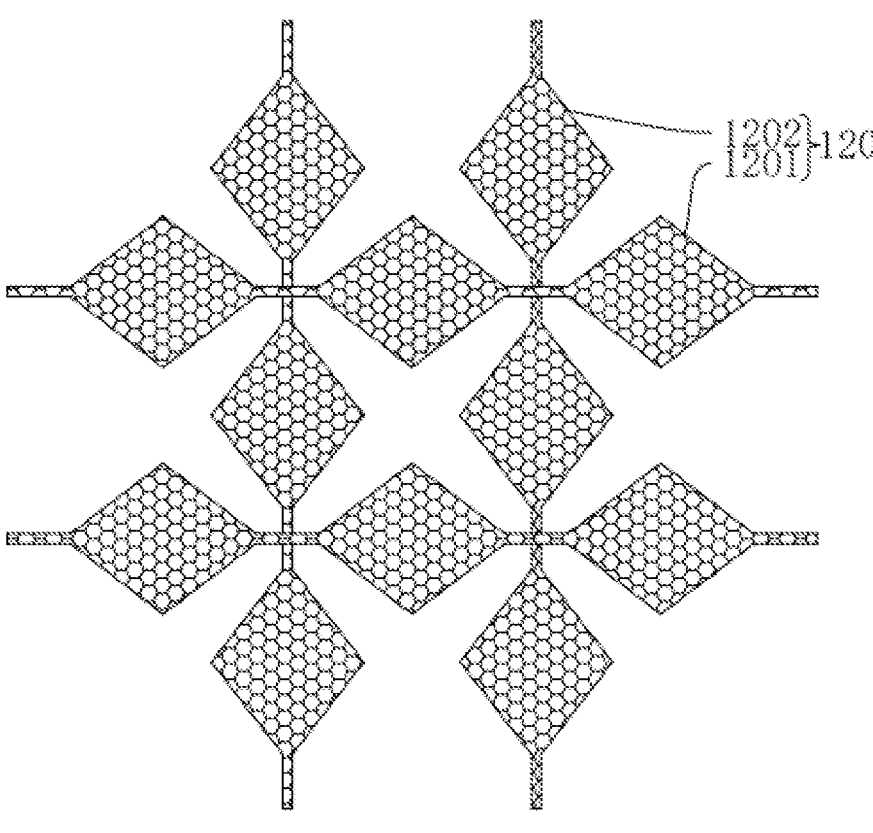
FIG. 4 is a plane schematic diagram of a touch electrode according to an embodiment of the present application.
Figure 5:
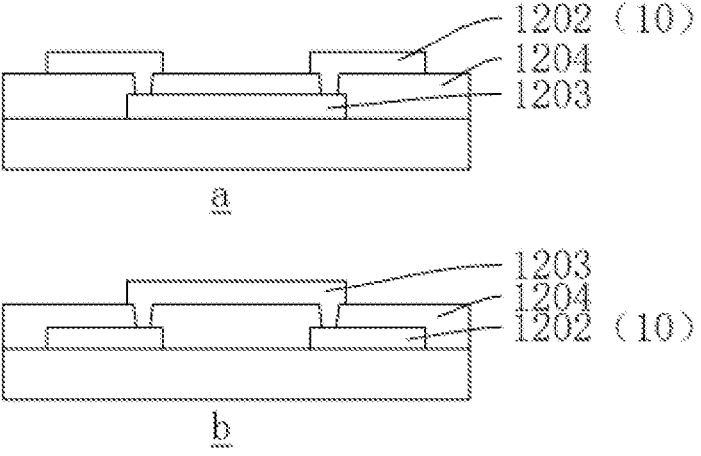
FIG. 5 is a cross-sectional schematic diagram of a touch electrode according to an embodiment of the present application.

Referring to FIG. 4 and FIG. 5, the touch portion 11 is disposed at least in the conventional display area 102, and the touch layer 10 includes a plurality of touch electrodes 120 distributed in the conventional display area 102. The plurality of touch electrodes 120 may include a plurality of first touch electrodes 1201 rowed longitudinally and extended transversely, and a plurality of second touch electrodes 1202 rowed transversely and extended longitudinally. Further, each of the plurality of first touch electrodes 1201 is continuously arranged in a transverse direction, and each of the plurality of second touch electrodes 1202 is disconnected at a position where the second touch electrode 1202 overlaps the first touch electrode 1201. It should be noted that the display panel may further include a bridge layer disposed on a side of the touch layer 10 close to the light-emitting layer 20, and an insulating layer 1204 disposed between the bridge layer and the touch layer 10. The bridge layer includes a plurality of bridge portions 1203, and each of the plurality of bridge portions 1203 is disposed correspondingly at a position where the second touch electrode 1202 overlaps the first touch electrode 1201. The second touch electrode 1202 passes through the insulating layer 1204 to connect with the bridge portion 1203, enabling the second touch electrode 1202 to be a continuous electrical connection structure in a longitudinal direction, as shown in a of FIG. 5. Alternatively, the bridge layer is disposed on a side of the touch layer 10 away from the light-emitting layer 20, and the bridge layer includes a plurality of bridge portions 1203. Each of the plurality of bridge portions 1203 is disposed correspondingly at a position where the second touch electrode 1202 overlaps the first touch electrode 1201. At a disconnected position of the second touch electrode 1202, the bridge portion 1203 is connected to the second touch electrode 1202 through a via hole passing through the insulating layer 1204, so as to enable each second touch electrode 1202 to be a continuous electrical connection structure in a longitudinal direction, as shown in b of FIG. 5.

In an embodiment of the present application, the touch layer 10 includes a plurality of metal grids and a plurality of connecting sub-portions. Each of the plurality of connecting sub-portions is connected between adjacent metal grids of the plurality of metal grids, so that the touch layer 10 forms a mesh structure, that is, the barrier portion 12 and the touch portion 11 are both mesh structures. The connecting sub-portions or the metal grids in the mesh structure corresponding to the touch portion 11 are separated so as to form a plurality of touch electrodes 120. The connecting sub-portions or the metal grids of the barrier portion 12 and the touch portion 11 are separated so that the barrier portion 12 is insulated from the touch portion 11.

Preferably, the barrier portion 12 and the touch portion 11 have a same mesh structure. Since the plurality of second light-emitting pixels 22 and the plurality of first light-emitting pixels 21 are arranged in a same manner, a same mask is used to form the barrier portion 12 and the touch portion 11 with the same mesh structure. Thus, the orthographic projections of the barrier portion 12 and the touch portion 11 on the substrate do not overlap the orthographic projections of the second light-emitting pixels 22 and the first light-emitting pixels 21 on the substrate. In the embodiment of the present application, the orthographic projections of a part of the second light-emitting pixels 22 on the touch layer 10 are located in the meshes of the mesh structure of the barrier portion 12, and the orthographic projections of the first light-emitting pixels 21 on the touch layer 10 are located in the meshes of the mesh structure of the barrier portion 12 or in the meshes of the mesh structure of the touch portion 11. As a result, on a basis that the touch layer 10 does not affect the emission of the light-emitting pixels, the barrier portion 12 and the touch portion 11 are formed using the same mask to simply the process of manufacturing.

Figure 3:
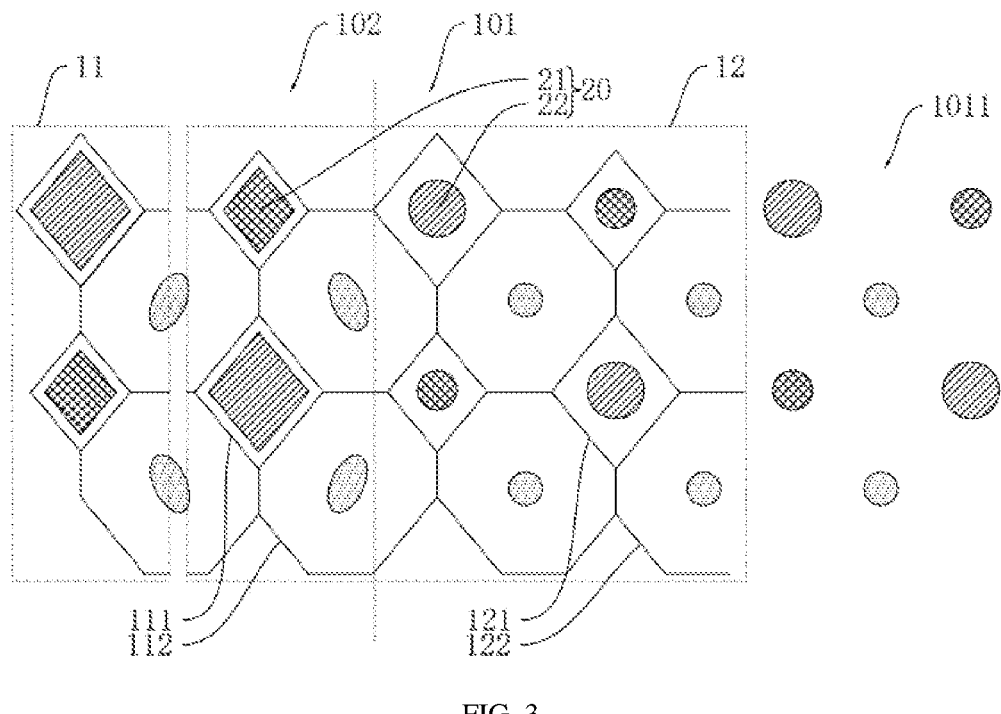
FIG. 3 is a plane schematic diagram of a touch layer according to an embodiment of the present application.

Specifically, referring to FIG. 3, the touch electrode (i.e., touch portion 11, and take touch portion 11 to illustrate in the following) includes a plurality of first metal grids 111 and a plurality of first connecting sub-portions 112 connected between any adjacent first metal grids 111. The touch portion 11 is disposed in the conventional display area 102. The orthographic projections of a part of the first light-emitting pixels 21 on the touch layer 10 are located in the first metal grids 111. Alternatively, the orthographic projections of a part of the first light-emitting pixels 21 on the touch layer are located between adjacent first metal grids 111, and are surrounded by the adjacent first metal grids 111 and the first connecting sub-portions 112 connecting the adjacent first metal grids 111. That is, the first metal grids 111 do not overlap the first light-emitting pixels 21 corresponding thereto.

The barrier portion 12 includes a plurality of second metal grids 121 and a plurality of second connecting sub-portions 122 connected between any adjacent second metal grids 121. The barrier portion 12 is disposed in the functional display area 101, and partially extends into the conventional display area 102 to be adjacent to the touch portion 11. The barrier portion 12 is insulated from the touch portion 11. The orthographic projections of another part of the first light-emitting pixels 21 on the touch layer 10 are located in the second metal grids 121. Alternatively, the orthographic projections of another part of the first light-emitting pixels 21 on the touch layer 10 are located between adjacent second metal grids 121, and are surrounded by the adjacent second metal grids 121 and the second connecting sub-portions 122 connecting the adjacent second metal grids 121. The orthographic projections of a part of the second light-emitting pixels 22 on the touch layer 10 are located in the second metal grids 121. Alternatively, the orthographic projections of a part of the second light-emitting pixels 22 on the touch layer 10 are located between adjacent second metal grids 121, and are surrounded by the adjacent second metal grids 121 and the second connecting sub-portions 122 connecting the adjacent second metal grids 121. That is, the second metal grids 121 do not overlap the first light-emitting pixels 21, or the second light-emitting pixels 22 corresponding thereto.

It should be understood that a part of the second light-emitting pixels 22 is also located in the opening 1011 and is not covered by the barrier portion 12.

In this embodiment, the first metal grids 111 and the second metal grids 121 are arranged in the same manner, and in a same unit area, the number of the first metal grids 111 equals to the number of the second metal grids 121. Further, if the area of the second light-emitting pixels 22 is smaller than the area of the first light-emitting pixels 21, the minimum distance between each of the second metal grids 121 and each of the second light-emitting pixels 22 corresponding thereto is greater than the minimum distance between each of the first metal grids 111 and each of the first light-emitting pixels 21 corresponding thereto, and the minimum distance between each of the second metal grids 121 and each of the second light-emitting pixels 22 corresponding thereto is greater than the minimum distance between each of the second metal grids 121 and each of the first light-emitting pixels 21 corresponding thereto.

Optionally, the barrier portion 12 is provided with at least two second metal grids 121 in a direction away from a center of the opening 1011, i.e. the barrier portion 12 may include at least two turns of the second metal grids 121 disposed around the opening 1011. In the present embodiment, the barrier portion 12 may include three turns of second metal grids 121 disposed around the opening 1011, and the orthographic projections of at least three turns of the light-emitting pixels disposed around the center of the opening 1011 on the touch layer 10 are located in the meshes of the mesh structure of the barrier portion 12. Wherein the orthographic projections of one turn of the first light-emitting pixels 21 on the touch layer 10 is located in the second metal grids 121 of the barrier portion 12, and the orthographic projections of two turns of the second light-emitting pixels 22 on the touch layer 10 are located in the second metal grids 121.

It should be noted that in the embodiment of the present application, the orthographic projections of the blue pixels and the red pixels on the touch layer 10 may be located in the metal grids, and the orthographic projections of the green pixels on the touch layer 10 may be located between the metal grids and surrounded by the adjacent metal grids and the connecting sub-portions connecting the adjacent metal grids. Further, since the area of the blue pixels is larger than the area of the red pixels, the area of the metal grids corresponding to the blue pixels may be set larger than the area of the metal grids corresponding to the red pixels.

Further, in the embodiment of the present application, the barrier portion 12 insulating from the touch portion 11 is provided on the side of the touch portion 11 close to the functional display area 101. However, in the process of manufacturing, the functional display area 101 needs to be etched to remove more material from the touch layer so as to form the opening 1011, thus, a large amount of etching solution is required for etching. In the embodiment of the present application, the barrier portion 12 is disposed between the touch portion 11 and the opening 1011 to act as a buffer therebetween. This is, the etching solution in the functional display area 101 fails to etch the touch portion 11 due to a barrier provided by the barrier portion 12, so that a yield of the etching of the touch portion 11 is increased, and a yield of the touch electrode and the display panel is increased.

Figure 6:
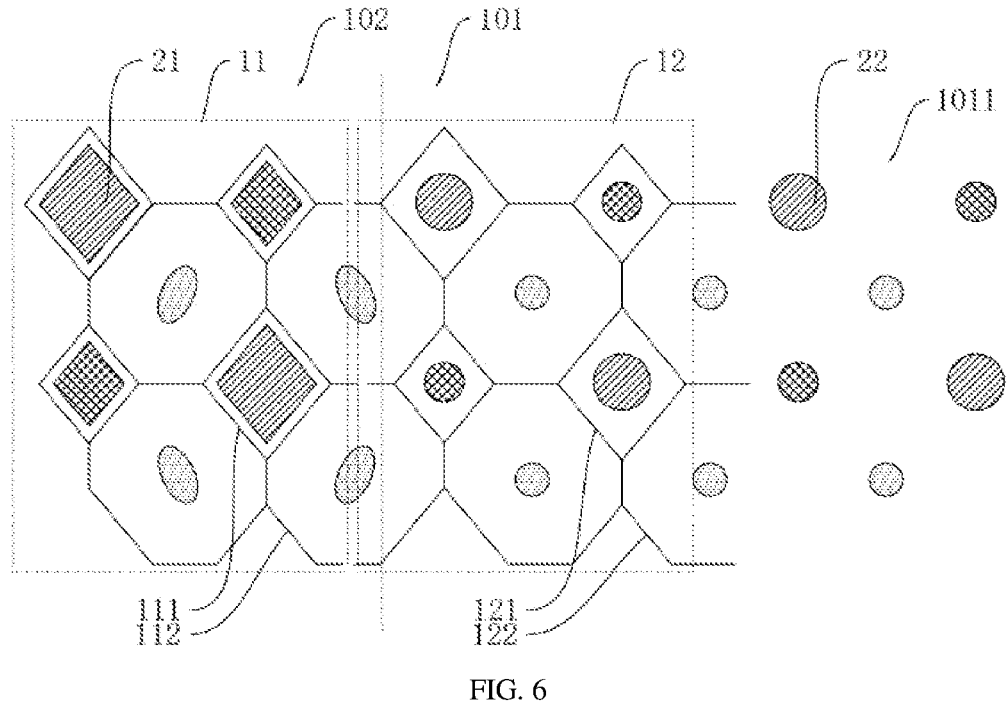
FIG. 6 is another plane schematic diagram of a touch layer according to an embodiment of the present application.

Referring to FIG. 6, another embodiment of the present application is provided in which the differences from the above embodiments are that: the barrier portion 12 is disposed in the functional display area 101 and around the opening 1011, and the touch portion 11 is disposed in the conventional display area 102 and around the functional display area 101. This is, the orthographic projections of a part of the second light-emitting pixels 22 on the touch layer 10 are located in the meshes of the mesh structure of the barrier portion 12, and the orthographic projections of the first light-emitting pixels 21 on the touch layer 10 are located in the meshes of the mesh structure of the touch portion 11.

Specifically, the touch portion 11 includes a plurality of first metal grids 111 and a plurality of first connecting sub-portions 112 connected between any adjacent first metal grids 111, and the touch portion 11 is disposed in the conventional display area 102. The orthographic projections of the first light-emitting pixels 21 on the touch layer 10 are located in the first metal grids 111. Alternatively, the orthographic projections of the first light-emitting pixels 21 on the touch layer 10 are located between adjacent first metal grids 111, and are surrounded by the adjacent first metal grids 111 and the first connecting sub-portions 112 connecting the adjacent first metal grids 111. That is, the first metal grids 111 do not overlap the first light-emitting pixels 21 corresponding thereto.

The barrier portion 12 includes a plurality of second metal grids 121 and a plurality of second connecting sub-portions 122 connected between any adjacent second metal grids 121. The barrier portion 12 is disposed in the functional display area 101, and is insulated from the touch portion 11. The orthographic projections of a portion of the second light-emitting pixels 22 on the touch layer 10 are located in the second metal grids 121. Alternatively, the orthographic projections of a portion of the second light-emitting pixels 22 on the touch layer 10 are located between adjacent second metal grids 121, and are surrounded by the adjacent second metal grids 121 and the second connecting sub-portions 122 connecting the adjacent second metal grids 121. That is, the second metal grids 121 do not overlap the second light-emitting pixels 22 corresponding thereto.

Further, in the embodiment of the present application, the barrier portion 12 insulating from the touch portion 11 is provided on the side of the touch portion 11 close to the functional display area 101. However, in the process of manufacturing, the functional display area 101 needs to be etched to remove more material from the touch layer so as to form the opening 1011, thus, a large amount of etching solution is required for etching. In the embodiment of the present application, the barrier portion 12 is disposed between the touch portion 11 and the opening 1011 to act as a buffer therebetween. This is, the etching solution in the functional display area 101 fails to etch the touch portion 11 due to a barrier provided by the barrier portion 12, so that a yield of the etching of the touch portion 11 is increased, and a yield of the touch electrode and the display panel is increased.

Figure 7:
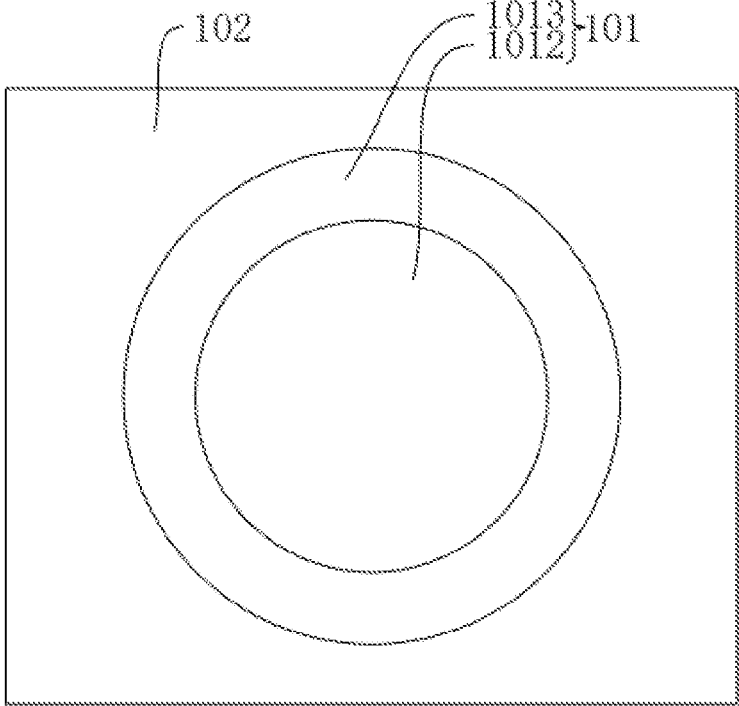
FIG. 7 is another plane distribution diagram of a display panel according to an embodiment of the present application.
Figure 8:
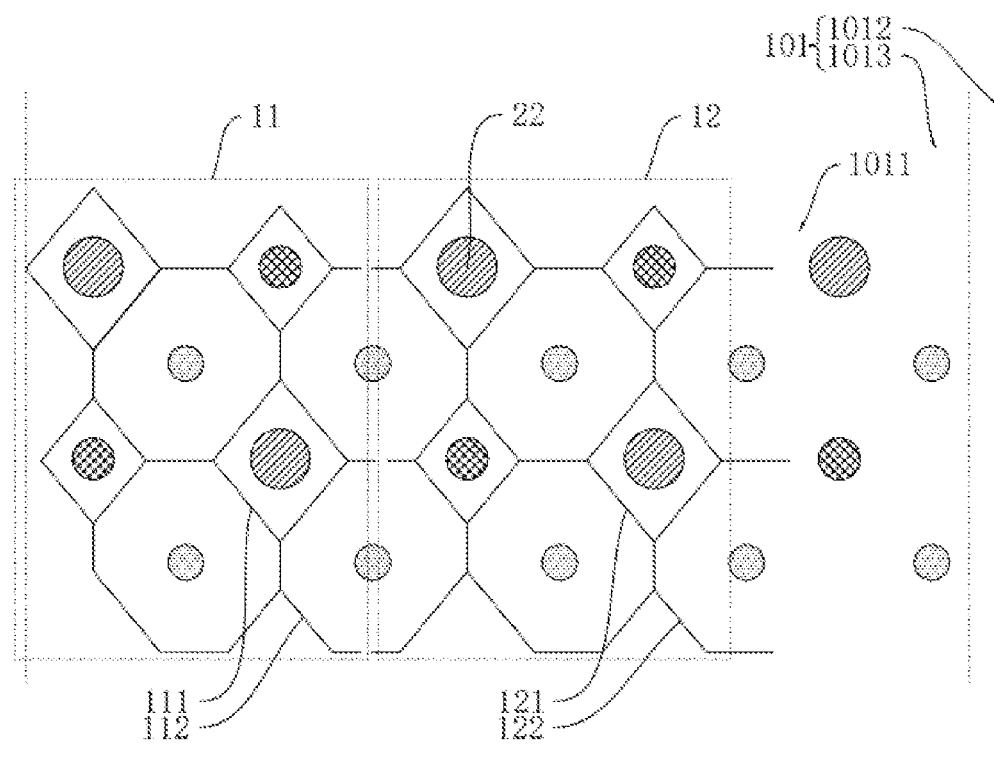
FIG. 8 is another plane schematic diagram of a touch layer according to an embodiment of the present application.

Referring to FIG. 7 and FIG. 8, another embodiment of the present application is provided. In the present application, the functional display area 101 includes a euphotic display sub-area 1012, and a transition sub-area 1013 disposed between the euphotic display sub-area 1012 and the conventional display area 102. The euphotic display sub-area 1012 may be used to correspondingly arrange a camera assembly.

Wherein the barrier portion 12 is disposed in the functional display area 101, and located in the transition sub-area 1013. The touch portion 11 is disposed in the conventional display area 102 and extended into the transition sub-area 103. This is, the orthographic projections of a part of the second light-emitting pixels 22 on the touch layer 10 are located in the meshes of the mesh structure of the barrier portion 12 and located in the meshes of the mesh structure of the touch portion 11. The orthographic projections of the first light-emitting pixels 21 on the touch layer 10 are located in the meshes in the mesh structure of the touch portion 11.

Specifically, the touch portion 11 includes a plurality of first metal grids 111, and a plurality of first connecting sub-portions 112 connected between any adjacent first metal grids 111. The touch portion 11 is disposed in the conventional display area 102. The orthographic projections of the first light-emitting pixels 21 on the touch layer 10 are located in the first metal grids 111. Alternatively, the orthographic projections of the first light-emitting pixels 21 on the touch layer 10 are located between adjacent first metal grids 111, and are surrounded by the adjacent first metal grids 111 and the first connecting sub-portions 112 connecting the adjacent first metal grids 111. The orthographic projections of a part of the second light-emitting pixels 22 on the touch layer 10 are located in the first metal grids 111. Alternatively, the orthographic projections of a part of the second light-emitting pixels 22 on the touch layer 10 are located between adjacent first metal grids 111, and are surrounded by the adjacent first metal grids 111 and the first connecting sub-portions 112 connecting the adjacent first metal grids 111. That is, the first metal grids 111 do not overlap the first light-emitting pixels 21 corresponding thereto, and the first metal grids 111 do not overlap the second light-emitting pixels 22 corresponding thereto.

The barrier portion 12 includes a plurality of second metal grids 121 and a plurality of second connecting sub-portions 122 connected between any adjacent second metal grids 121. The barrier portion 12 is disposed in the functional display area 101, and is insulated from the touch portion 11. The orthographic projections of a portion of the second light-emitting pixels 22 on the touch layer 10 are located in the second metal grids 121. Alternatively, the orthographic projections of a portion of the second light-emitting pixels 22 on the touch layer 10 are located between adjacent second metal grids 121, and are surrounded by the adjacent second metal grids 121 and second connecting sub-portions 122 connecting the adjacent second metal grids 121. That is, the second metal grids 121 do not overlap the second light-emitting pixels 22 corresponding thereto.

In the present embodiment, a boundary of the barrier portion 12 close to the euphotic display sub-area 1012 is spaced apart from a boundary of the transition sub-area 1013 close to the euphotic display sub-area 1012, that is, a part of the second light-emitting pixels 22 located within the transition sub-area 1013 is located outside a coverage of the barrier portion 12.

Further, in the embodiment of the present application, the barrier portion 12 insulating from the touch portion 11 is provided on the side of the touch portion 11 close to the functional display area 101. However, in the process of manufacturing, the functional display area 101 needs to be etched to remove more material from the touch layer so as to form the opening 1011, thus, a large amount of etching solution is required for etching. In the embodiment of the present application, the barrier portion 12 is disposed between the touch portion 11 and the opening 1011 to act as a buffer therebetween. This is, the etching solution in the functional display area 101 fails to etch the touch portion 11 due to a barrier provided by the barrier portion 12, so that a yield of the etching of the touch portion 11 is increased, and a yield of the touch electrode and the display panel is increased. Further, in the present embodiment, since the barrier portion 12 is disposed in the transition sub-area 1013, the light transmittance of the euphotic display sub-area 1012 will not be affected, and the imaging effect of the camera assembly corresponding to the euphotic display sub-area 1012 can be improved.

Figure 9:
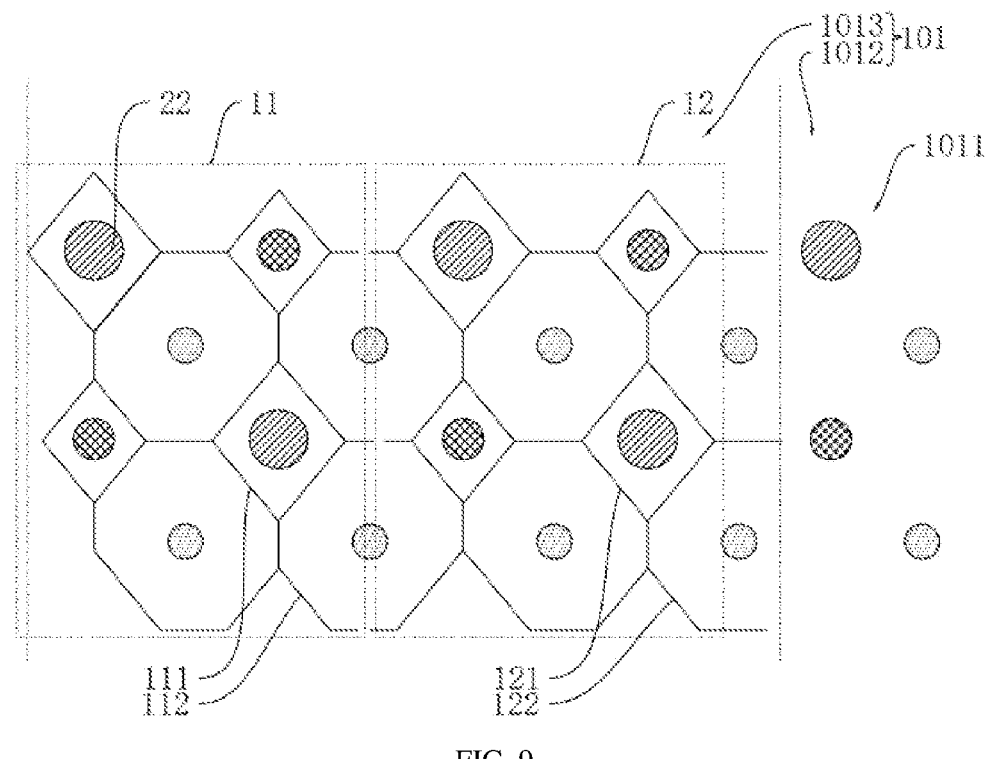
FIG. 9 is another plane schematic diagram of a touch layer according to an embodiment of the present application.

Referring to FIG. 9, in another embodiment of the present application, the barrier portion 12 is disposed in the functional display area 101 and is located in the transition sub-area 1013. The touch portion 11 is disposed in the conventional display area 102 and extends into the transition sub-area 1013. That is, the orthographic projections of a part of the second light-emitting pixels 22 on the touch layer 10 are located in the meshes of the mesh structure of the barrier portion 12 and the meshes of the mesh structure of the touch portion 11, and the orthographic projections of the first light-emitting pixels 21 on the touch layer 10 are located in the meshes of the mesh structure of the touch portion 11.

Specifically, the touch portion 11 includes a plurality of first metal grids 111 and a plurality of first connecting sub-portions 112 connected between any adjacent first metal grids 111, and the touch portion 11 is disposed in the conventional display area 102. The orthographic projections of the first light-emitting pixels 21 on the touch layer 10 are located in the first metal grids 111. Alternatively, the orthographic projections of the first light-emitting pixels 21 on the touch layer 10 are located between adjacent first metal grids 111, and are surrounded by the adjacent first metal grids 111 and the first connecting sub-portions 112 connecting the adjacent first metal grids 111. The orthographic projections of a part of the second light-emitting pixels 22 on the touch layer 10 are located in the first metal grids 111. Alternatively, the orthographic projections of a part of the second light-emitting pixels 22 on the touch layer 10 are located between adjacent first metal grids 111, and are surrounded by the adjacent first metal grids 111 and the first connecting sub-portions 112 connecting the adjacent first metal grids 111. That is, the first metal grids 111 do not overlap the first light-emitting pixels 21 or the second light-emitting pixels 22 corresponding thereto.

The barrier portion 12 includes a plurality of second metal grids 121 and a plurality of second connecting sub-portions 122 connected between any adjacent second metal grids 121. The barrier portion 12 is disposed in the functional display area 101, and is insulated from the touch portion 11. The orthographic projections of a portion of the second light-emitting pixels 22 on the touch layer 10 are located in the second metal grids 121. Alternatively, the orthographic projections of a portion of the second light-emitting pixels 22 on the touch layer 10 are located between adjacent second metal grids 121, and are surrounded by the adjacent second metal grids 121 and the second connecting sub-portions 122 connecting the adjacent second metal grids 121. That is, the second metal grids 121 do not overlap the second light-emitting pixels 22 corresponding thereto.

In this embodiment, a boundary of the barrier portion 12 close to the euphotic display sub-area 1012 overlaps a boundary of the transition sub-area 1013 close to the euphotic display sub-area 1012.

Further, in the embodiment of the present application, the barrier portion 12 insulating from the touch portion 11 is provided on a side of the touch portion 11 close to the functional display area 101. However, in the process of manufacturing, the functional display area 101 needs to be etched to remove more material from the touch layer so as to form the opening 1011, thus, a large amount of etching solution is required for etching. In the embodiment of the present application, the barrier portion 12 is disposed between the touch portion 11 and the opening 1011 to act as a buffer therebetween. This is, the etching solution in the functional display area 101 fails to etch the touch portion 11 due to a barrier provided by the barrier portion 12, so that a yield of the etching of the touch portion 11 is increased, and a yield of the touch electrode and the display panel is increased. Further, in the present embodiment, since the barrier portion 12 is disposed in the transition sub-area 1013, the light transmittance of the euphotic display sub-area 1012 will not be affected, and the imaging effect of the camera assembly corresponding to the euphotic display sub-area 1012 can be improved.

Figure 10:
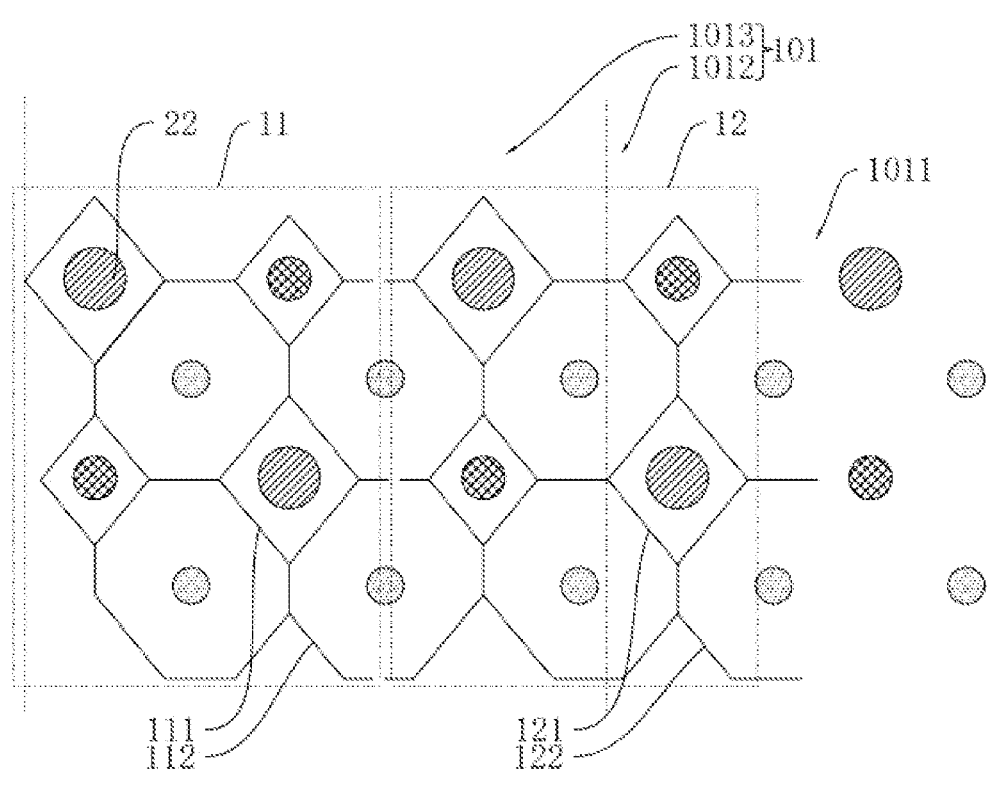
FIG. 10 is another plane schematic diagram of a touch layer according to an embodiment of the present application.

Referring to FIG. 10, in another embodiment of the present application, the barrier portion 12 is disposed in the functional display area 101. The barrier portion 12 is located in the transition sub-area 1013 and partially extends into the euphotic display sub-area 1012. The touch portion 11 is disposed in the conventional display area 102 and extends into the transition sub-area 1013. That is, the orthographic projections of a portion of the second light-emitting pixels 22 on the touch layer 10 are located in the meshes of the mesh structure of the barrier portion 12 and the meshes of the mesh structure of the touch portion 11. The orthographic projections of the first light-emitting pixels 21 on the touch layer 10 are located in the meshes of the mesh structure of the touch portion 11.

Specifically, the touch portion 11 includes a plurality of first metal grids 111 and a plurality of first connecting sub-portions 112 connected between any adjacent first metal grids 111, and the touch portion 11 is disposed in the conventional display area 102. The orthographic projections of the first light-emitting pixels 21 on the touch layer 10 are located in the first metal grids 111. Alternatively, the orthographic projections of the first light-emitting pixels 21 on the touch layer 10 are located between adjacent first metal grids 111, and are surrounded by the adjacent first metal grids 111 and the first connecting sub-portions 112 connecting the adjacent first metal grids 111. The orthographic projections of a part of the second light-emitting pixels 22 on the touch layer 10 are located in the first metal grids 111. Alternatively, the orthographic projections of a part of the second light-emitting pixels 22 on the touch layer 10 are located between adjacent first metal grids 111, and are surrounded by the adjacent first metal grids 111 and the first connecting sub-portions 112 connecting the adjacent first metal grids 111. That is, the first metal grids 111 do not overlap the first light-emitting pixels 21 or the second light-emitting pixels corresponding thereto.

The barrier portion 12 includes a plurality of second metal grids 121 and a plurality of second connecting sub-portions 122 connected between any adjacent second metal grids 121. The barrier portion 12 is disposed in the functional display area 101, and is insulated from the touch portion 11. The orthographic projections of a portion of the second light-emitting pixels 22 on the touch layer 10 are located in the second metal grids 121. Alternatively, the orthographic projections of a portion of the second light-emitting pixels 22 on the touch layer 10 are located between adjacent second metal grids 121, and are surrounded by the adjacent second metal grids 121 and the second connecting sub-portions 122 connecting the adjacent second metal grids 121. That is, the second metal grids 121 do not overlap the second light-emitting pixels 22 corresponding thereto.

In this embodiment, the barrier portion 12 is partially overlapped with the euphotic display sub-area 1012.

Further, in the embodiment of the present application, the barrier portion 12 insulating from the touch portion 11 is provided on the side of the touch portion 11 close to the functional display area 101. However, in the process of manufacturing, the functional display area 101 needs to be etched to remove more material from the touch layer so as to form the opening 1011, thus, a large amount of etching solution is required for etching. In the embodiment of the present application, the barrier portion 12 is disposed between the touch portion 11 and the opening 1011 to act as a buffer therebetween. This is, the etching solution in the functional display area 101 fails to etch the touch portion 11 due to a barrier provided by the barrier portion 12, so that a yield of the etching of the touch portion 11 is increased, and a yield of the touch electrode and the display panel is increased.

Figure 11:
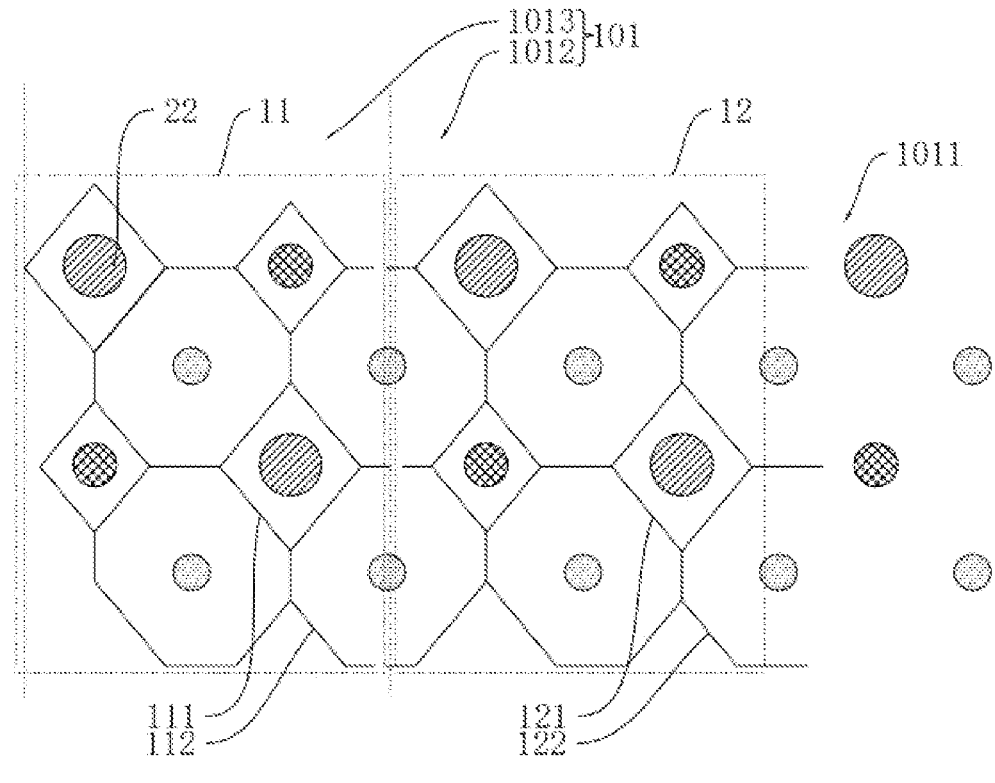
FIG. 11 is another plane schematic diagram of a touch layer according to an embodiment of the present application.

Referring to FIG. 11, in another embodiment of the present application, the barrier portion 12 is located in the euphotic display sub-area 1012, and the touch portion 11 is located in the conventional display area 102 and partially extends into the transition sub-area 1013. That is, the orthographic projections of a portion of the second light-emitting pixels 22 on the touch layer 10 are located in the meshes of the mesh structure of the barrier portion 12. The orthographic projections of the first light-emitting pixels 21 on the touch layer 10 are located in the meshes of the mesh structure of the touch portion 11.

Specifically, the touch portion 11 includes a plurality of first metal grids 111 and a plurality of first connecting sub-portions 112 connected between any adjacent first metal grids 111, and the touch portion 11 is disposed in the conventional display area 102. The orthographic projections of the first light-emitting pixels 21 on the touch layer 10 are located in the first metal grids 111. Alternatively, the orthographic projections of the first light-emitting pixels 21 on the touch layer 10 are located between adjacent first metal grids 111, and are surrounded by the adjacent first metal grids 111 and the first connecting sub-portions 112 connecting the adjacent first metal grids 111. The orthographic projections of a part of the second light-emitting pixels 22 on the touch layer 10 are located in the first metal grids 111. Alternatively, the orthographic projections of a part of the second light-emitting pixels 22 on the touch layer 10 are located between adjacent first metal grids 111, and are surrounded by the adjacent first metal grids 111 and the first connecting sub-portions 112 connecting the adjacent first metal grids 111. That is, the first metal grids 111 do not overlap the first light-emitting pixels 21 or the second light-emitting pixels corresponding thereto.

The barrier portion 12 includes a plurality of second metal grids 121 and a plurality of second connecting sub-portions 122 connected between any adjacent second metal grids 121. The barrier portion 12 is disposed in the functional display area 101, and is insulated from the touch portion 11. The orthographic projections of a portion of the second light-emitting pixels 22 on the touch layer 10 are located in the second metal grids 121. Alternatively, the orthographic projections of a portion of the second light-emitting pixels 22 on the touch layer 10 are located between adjacent second metal grids 121, and are surrounded by the adjacent second metal grids 121 and the second connecting sub-portions 122 connecting the adjacent second metal grids 121. That is, the second metal grids 121 do not overlap the second light-emitting pixels 22 corresponding thereto.

In the present embodiment, the barrier portion 12 is located in the euphotic display sub-area 1012, and the touch portion 11 covers the conventional display area 102 and the transition sub-area 1013.

Further, in the embodiment of the present application, the barrier portion 12 insulating from the touch portion 11 is provided on the side of the touch portion 11 close to the functional display area 101. However, in the process of manufacturing, the functional display area 101 needs to be etched to remove more material from the touch layer so as to form the opening 1011, thus, a large amount of etching solution is required for etching. In the embodiment of the present application, the barrier portion 12 is disposed between the touch portion 11 and the opening 1011 to act as a buffer therebetween. This is, the etching solution in the functional display area 101 fails to etch the touch portion 11 due to a barrier provided by the barrier portion 12, so that a yield of the etching of the touch portion 11 is increased, and a yield of the touch electrode and the display panel is increased.

Further, since the barrier portion 12 is located between the touch portion 11 and the opening 1011, in the process of manufacturing, the barrier portion 12 blocks the etching solution at the opening 1011. There is a possibility that the barrier portion 12 would be etched due to a large amount of the etching solution at the opening 1011. Thus, in the embodiment of the present application, the line width of the mesh structure of the barrier portion 12 is less than or equal to the line width of the mesh structure of the touch portion 11.

In addition, an embodiment of the present application further provides a display device including the display panel and the camera assembly described in the above embodiment. The camera assembly is disposed on a side of the display panel corresponding to the functional display area 101, and further, the camera assembly is disposed on a side of the display panel corresponding to the functional display area 101. Specifically, the camera assembly is disposed on a side of the display panel corresponding to the euphotic display sub-area 1012.

In the embodiment of the present application, the touch layer 10 includes an opening 1011 in the functional display area 101 to improve the light transmittance of the functional display area 101 and further improve the imaging effect of the camera assembly. Further, the light-emitting pixels in the light-emitting layer 20 are simultaneously distributed in the conventional display 102 and the functional display area 101, so that the display function and the imaging function of the camera assembly can be achieved in the functional display area 101. Further, in the embodiment of the present application, the barrier portion 12 is disposed between the touch portion 11 and the opening 1011. Further, the barrier portion 12 can block the etching solution at the opening 1011 from etching the touch portion 11, thereby increasing the yield of the touch portion 11 and the yield of the display panel.

In the above-described embodiments, the descriptions of the various embodiments are each focused, and portions of some embodiments that are not detailed may be referred to the related descriptions of other embodiments.

The display panel and the display device provided in the embodiments of the present application are described in detail above. The principles and embodiments of the present application are described in detail herein. The description of the embodiments is merely intended to help understand the technical solutions and core ideas of the present application. Those of ordinary skill in the art will appreciate that they may still modify the technical solutions described in the foregoing embodiments, or equivalently replace some of the technical features therein. These modifications or substitutions do not deviate the nature of the respective solutions from the scope of the solutions of the embodiments of the present application.

What is claimed is:

1. A display panel, comprising a functional display area, and a conventional display area disposed around the functional display area;

wherein the display panel further comprises:

a substrate;

a light-emitting layer disposed on the substrate and comprising a plurality of light-emitting pixels, wherein the plurality of light-emitting pixels comprises a plurality of first light-emitting pixels disposed in the conventional display area and a plurality of second light-emitting pixels disposed in the functional display area; and in a same unit area, a number of the first light-emitting pixels is same as a number of the second light-emitting pixels;

a touch layer disposed on a side of the light-emitting layer away from the substrate, wherein the touch layer comprises an opening disposed in the functional display area, a barrier portion disposed around the opening, and a touch portion disposed on a side of the barrier portion away from the opening and located at least in the conventional display area; and the barrier portion is insulated from the touch portion;

wherein at least a part of the barrier portion is disposed in the functional display area, and an orthographic projection of the barrier portion on the substrate is not overlapped with the orthographic projections of the first light-emitting pixels on the substrate and the orthographic projections of the second light-emitting pixels on the substrate; and wherein the touch portion comprises a plurality of touch electrodes, the touch electrodes comprise a plurality of first metal grids electrically connected to each other; the barrier portion comprises a plurality of second metal grids electrically connected to each other; and in the same unit area, a number of the second metal grids is same as a number of the first metal grids.

2. The display panel according to claim 1, wherein at least a part of the first metal grids is disposed corresponding to the first light-emitting pixels and is not overlapped with the first light-emitting pixels corresponding thereto; and each of the second metal grids is disposed corresponding to the second light-emitting pixels or the first light-emitting pixels, and each of the second metal grids is not overlapped with the second light-emitting pixels or the first light-emitting pixels corresponding thereto.

3. The display panel according to claim 2, wherein a minimum distance between each of the second metal grids and each of the second light-emitting pixels corresponding thereto is greater than a minimum distance between each of the first metal grids and each of the first light-emitting pixels corresponding thereto.

4. The display panel according to claim 3, wherein the minimum distance between each of the second metal grids and each of the second light-emitting pixels corresponding thereto is greater than a minimum distance between each of the second metal grids and each of the first light-emitting pixels corresponding thereto.

5. The display panel according to claim 3, wherein an area of the second light-emitting pixels of a first color is smaller than an area of the first light-emitting pixels of the first color, and the first color comprises any color of red, green, and blue.

6. The display panel according to claim 2, wherein the barrier portion is provided with at least two of the second metal grids in a direction away from a center of the opening.

7. The display panel according to claim 2, wherein a line width in the second metal grids is less than or equal to a line width in the first metal grids.

8. The display panel according to claim 2, wherein a part of the first metal grids is further disposed corresponding to the second light-emitting pixels and is not overlapped with the second light-emitting pixels corresponding thereto, and the second metal grids are disposed corresponding to the second light-emitting pixels and are not overlapped with the second light-emitting pixels corresponding thereto.

9. The display panel according to claim 1, wherein the functional display area comprises a euphotic display sub-area, and a transition sub-area between the euphotic display sub-area and the conventional display area;

at least part of the barrier portion is disposed in the transition sub-area.

10. The display panel according to claim 9, wherein the barrier portion is disposed outside the euphotic display sub-area.

11. A display device, comprising a display panel and a camera assembly, wherein the display panel comprises a functional display area, and a conventional display area disposed around the functional display area, and the camera assembly is disposed on a side of the display panel and corresponding to the functional display area;

wherein the display panel further comprises:

a substrate;

a light-emitting layer disposed on the substrate and comprising a plurality of light-emitting pixels, wherein the plurality of light-emitting pixels comprises a plurality of first light-emitting pixels disposed in the conventional display area and a plurality of second light-emitting pixels disposed in the functional display area; and in a same unit area, a number of the first light-emitting pixels is same as a number of the second light-emitting pixels;

a touch layer disposed on a side of the light-emitting layer away from the substrate, wherein the touch layer comprises an opening disposed in the functional display area, a barrier portion disposed around the opening, and a touch portion disposed on a side of the barrier portion away from the opening and located at least in the conventional display area; and the barrier portion is insulated from the touch portion;

wherein at least a part of the barrier portion is disposed in the functional display area, and an orthographic projection of the barrier portion on the substrate is not overlapped with the orthographic projections of the first light-emitting pixels on the substrate and the orthographic projections of the second light-emitting pixels on the substrate; and wherein the touch portion comprises a plurality of touch electrodes, the touch electrodes comprise a plurality of first metal grids electrically connected to each other; the barrier portion comprises a plurality of second metal grids electrically connected to each other; and in the same unit area, a number of the second metal grids is same as a number of the first metal grids.

12. The display device according to claim 11, wherein at least a part of the first metal grids is disposed corresponding to the first light-emitting pixels and is not overlapped with the first light-emitting pixels corresponding thereto; and each of the second metal grids is disposed corresponding to the second light-emitting pixels or the first light-emitting pixels, and each of the second metal grids is not overlapped with the second light-emitting pixels or the first light-emitting pixels corresponding thereto.

13. The display device according to claim 12, wherein a minimum distance between each of the second metal grids and each of the second light-emitting pixels corresponding thereto is greater than a minimum distance between each of the first metal grids and each of the first light-emitting pixels corresponding thereto.

14. The display device according to claim 13, wherein the minimum distance between each of the second metal grids and each of the second light-emitting pixels corresponding thereto is greater than a minimum distance between each of the second metal grids and each of the first light-emitting pixels corresponding thereto.

15. The display device according to claim 13, wherein an area of the second light-emitting pixels of a first color is smaller than an area of the first light-emitting pixels of the first color, and the first color comprises any color of red, green, and blue.

16. The display device according to claim 12, wherein the barrier portion is provided with at least two of the second metal grids in a direction away from a center of the opening.

17. The display device of claim 12, wherein a line width in the second metal grids is less than or equal to a line width in the first metal grids.

18. The display device of claim 12, wherein a part of the first metal grids is further disposed corresponding to the second light-emitting pixels and is not overlapped with the second light-emitting pixels corresponding thereto, and the second metal grids are disposed corresponding to the second light-emitting pixels and are not overlapped with the second light-emitting pixels corresponding thereto.

19. The display device of claim 11, wherein the functional display area comprises a euphotic display sub-area, and a transition sub-area between the euphotic display sub-area and the conventional display area;

at least part of the barrier portion is disposed in the transition sub-area.

20. The display device according to claim 19, wherein the barrier portion is disposed outside the euphotic display sub-area.

* * * * *